United States Patent [19]

Baker et al.

[11] Patent Number: 5,488,310

[45] Date of Patent: Jan. 30, 1996

[54] RETURN-LOSS DETECTION FOR SERIAL DIGITAL SOURCE

[75] Inventors: Daniel G. Baker, Aloha; Robert W. Parish, Gaston; Scott E. Zink, Portland, all of Oreg.

[73] Assignee: Tektronix, Inc., Wilsonville, Oreg.

[21] Appl. No.: 294,274

[22] Filed: Aug. 22, 1994

[51] Int. Cl.$^6$ ................................................ G01R 17/00
[52] U.S. Cl. .................. 324/648; 324/725; 324/603; 324/534; 324/646; 370/13; 370/28; 375/224
[58] Field of Search .......................... 324/646, 603, 324/534, 526, 725, 625, 648; 375/10; 370/13, 28

[56] References Cited

U.S. PATENT DOCUMENTS 3,244,975  4/1966  Bauer .......................... 324/534
3,774,107  11/1973  Dunwoodie ..................... 324/725

*Primary Examiner*—Kenneth A. Wieder
*Assistant Examiner*—Jose M. Solis
*Attorney, Agent, or Firm*—Francis I. Gray

[57] ABSTRACT

A return-loss detector for a serial digital signal source uses a return-loss bridge circuit to exploit the broadband spectral characteristics of a serial digital signal from the signal source to monitor the termination conditions of a system being driven. A differential pair of serial digital signals from the source are input to the bridge circuit having a reference termination in one leg and the system termination in the other. A broadband detector is used at the output of the bridge circuit to generate an error signal, which is measured by a detector or metering circuit. The measured signal may be displayed as a value in dB or may be input to a comparator to provide an alarm or warning signal to an operator.

8 Claims, 1 Drawing Sheet

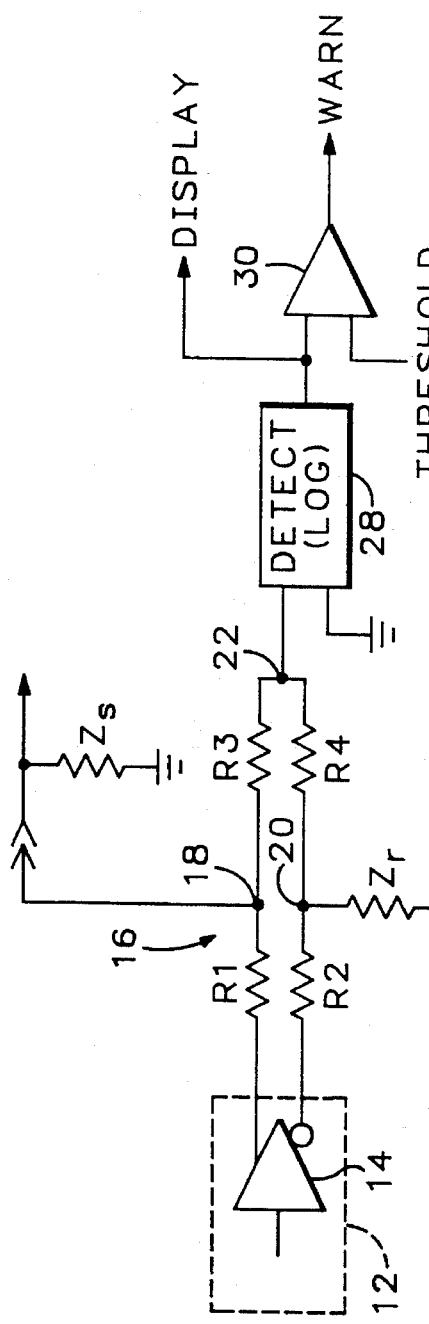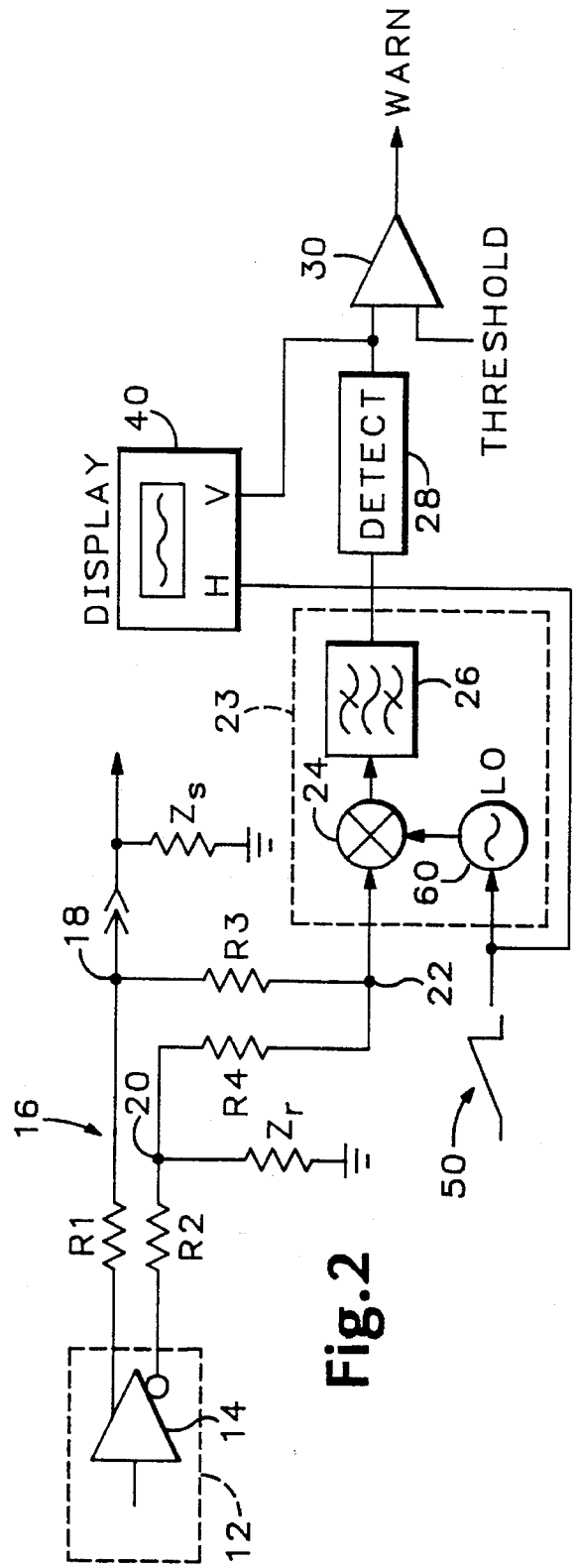

RETURN-LOSS DETECTION FOR SERIAL DIGITAL SOURCE

BACKGROUND OF THE INVENTION

The present invention relates to monitoring the termination of a cable, and more particularly to a return-loss detector for a serial digital source to monitor the termination conditions of a system being driven by the source.

To test a serial digital receiver or other system at the end of a cable a serial digital signal from a serial digital source is applied to a source end of the cable. If the cable is not terminated with the cable's characteristic impedance, the return-loss at the source end of the cable is decreased. This decrease in return-loss at the source end causes undesired signal voltage levels that may severely degrade the performance of the serial digital receiver or other system at the termination end of the cable. To determine at the source end if the cable is properly terminated, a standard method is to disconnect the serial digital source from the source end and to couple either a time domain reflectometer or a network analyzer with a signal source to the source end, which takes the serial digital source out of service.

What is desired is a return-loss detector for a serial digital source that indicates to an operator the status of the termination of a cable being driven by the serial digital source without taking the serial digital source out of service or requiring separate, relatively expensive test equipment.

SUMMARY OF THE INVENTION

Accordingly the present invention provides a return-loss detector for a serial digital source that places a return-loss bridge circuit at a serial digital output of the serial digital source to exploit the broadband spectral characteristics of the serial digital output. The serial digital signal from the source is convened to a differential serial digital signal and applied to separate arms of the return-loss bridge circuit. The outputs from the arms of the bridge circuit are summed, and then input to a broadband detector. The input to the broadband detector may be bandpass filtered. For display of return-loss versus frequency a swept frequency system, such as a swept frequency spectrum analyzer, may be used to provide a superheterodyne effect. The sweep signal is used to drive the horizontal display while the output of the detector drives the vertical display. The detector output may be convened into a readout for display, such as an alphanumeric dB value, and/or applied to a comparator where it is compared with a return-loss threshold to produce an alarm or warning to an operator.

The objects, advantages and other novel features of this invention are apparent from the following detailed description when read in conjunction with the appended claims and attached drawing.

BRIEF DESCRIPTION OF THE DRAWING

FIG. 1 is a block diagram for a first embodiment of a return-loss detector for a serial digital source according to the present invention.

FIG. 2 is a block diagram for a second embodiment of a return-loss detector for a serial digital source according to the present invention.

DESCRIPTION OF THE PREFERRED EMBODIMENT

Referring now to FIG. 1 a serial digital signal from a serial digital source 12 is input to a cable driver 14. The cable driver 14 converts the serial digital signal from a single ended signal to a differential pair of serial digital signals. The differential pair of serial digital signals is input to a return-loss bridge 16 composed of four resistors, one of which is a cable system impedance Zs. One of the differential serial digital signals is coupled via a first resistor R1 of the bridge 16 to an output terminal 18 to which the cable system impedance Zs to be monitored also is coupled, i.e., the load being driven by the serial digital source 12. The other differential serial digital signal is coupled via a second resistor R2, having an impedance equal to that of the first resistor R1, to a reference terminal 20 to which a reference terminator Zr also is coupled. Coupled between the output terminal 18 and the reference terminal 20 and a measurement point 22 are a pair of resistors R3, R4, respectively, which form a summing circuit. The output from the summing circuit is input to a log detector or signal-strength meter IC 28 which drives a return-loss display, such as a symbol on a display screen. The output from the log detector 28 also drives a comparator 30 having a return-loss threshold input to provide an alarm, or warning, indicator. The return-loss threshold may be set to provide an alarm when the mismatch varies from expected values by a given dB level, i.e., for a nominal 75 ohm cable values of less than 37.5 ohms or greater than 150 ohms produce an alarm or warning signal.

In another embodiment, as shown in FIG. 2, output from the summing circuit is input to a tunable down converter 23. This constitutes the well-known superheterodyne receiver or swept spectrum analyzer to selectively tune with a narrow resolution bandwidth the broadband serial digital signal spectrum, thereby measuring and plotting the return-loss as a function of frequency. The resolution bandwidth is determined by an intermediate frequency (IF) filter 26, and the log detector 28 at the output of the tunable down converter 23 drives the vertical deflection of an XY display 40. A value of 300 Khz for the resolution bandwidth works well for plotting return-loss versus frequency. A sweep voltage signal 50 is applied to a local oscillator 60 for providing a mixing frequency for the tunable down converter 23, and also is applied to the horizontal deflection circuitry of the display 40. Vertical calibration for the display 40 may be in the form of dB's/div and horizontal calibration in the form of MHZ/div. The frequency plotting range for return-loss is limited to the upper frequency range of the serial digital signal and the vertical calibration may be corrected to frequencies near the null-bandwidth. The output from the detector 28 is in the form of dBs of return loss across an output impedance Zo, which may be internal to the display 40. The output from the detector circuit 28 may be input to the comparator 30 where it is compared with the return-loss threshold signal. The output of the comparator 30 provides the return-loss alarm signal that may be used to drive an indicator, such as a light emitting diode (LED), or drive a sound amplifier to provide an audio indication when there is a mismatch between the system termination Zs and the reference termination Zr.

The reference termination Zr may be in the form of several parallel resistors coupled via a switch to the reference terminal 20 so that the serial digital source can be set up to match the expected system termination Zs, whether it be 50 ohms, 75 ohms or some other value. A broadband bandpass filter may be used before the detector 28 in FIG. 1 to restrict the range of frequencies over which the return-loss is measured or averaged. For example the return-loss errors caused by cable impedance mismatches only at very low or very high frequencies may be of less or no concern for proper system operation. In the FIG. 2 embodiment the resolution bandpass (IF) filter 26 substantially restricts the frequency range at each instantaneous frequency and determines the horizontal or frequency-resolution of the swept frequency return-loss measurement. Optionally an additional bandpass filter at the output of the mixer 24 may be inserted to restrict the upper and lower range of the frequency sweep.

In the well-known Wheatstone bridge a reference signal is applied to the top of the bridge and the detector or metering circuit is connected across the arms of the bridge in order to detect the difference signal across the bridge. This requires that the detector have a floating or differential input to connect across the arms of the bridge. Since available integrated circuits prefer that their inputs be referenced to ground, the bridge arms in this case are driven separately with the differential serial digital signals from the cable driver 14. The arm voltages are then already in differential form and can simply be summed with the two resistors R3, R4 into the input of the detector 28 referenced to ground. The detector 28 is best accomplished with available low-cost communication integrated circuits which take the logarithm of the magnitude of the input signal power for S metering or received signal strength indication of the carrier signal in such systems as cellular telephones. The output voltage Vo from the detector 28 is proportional to the $\log((v1+v2)^2)$, where v1 and v2 are the voltages at the arms of the differentially driven bridge 16. The voltages v1 and v2 add to zero when the bridge is balanced, i.e., the condition of proper cable termination over the frequency band of interest. When this condition occurs, the detector output Vo is very small and below the return-loss threshold voltage.

In operation the serial digital source 12 outputs a serial digital signal that is converted to a differential signal, with one signal being applied to the cable system impedance Zs. The other differential serial digital signal is applied to the reference termination Zr. The frequency of the serial digital signal is in the 100 MHZ range. For example the serial digital video signals used in today's video studios have null bandwidths from 143–270 MHZ. The differential serial digital signals from the output and reference terminals 18, 20 are summed by the summing resistors R3, R4 to provide a summed signal at the input to the broadband detector 28. If the terminations Zs, Zr are matched, the input to the broadband detector 28 is zero. The broadband detector 28 provides an output at a suitable metering frequency sufficient to detect changes in return loss, such as 10 Hz. Preferably the detector 28, such as a Motorola MC13055/D or Analog Devices AD606, operates as a multistage limiter where the successive stages are driven into compression and a metering voltage or current summed over the stages is output proportional to the log of the power of the input signal. The value of the return-loss signal may be displayed as a value in dB and/or may be compared with a nominal return-loss threshold that eliminates noise triggering to provide the alarm or warning signal when there is a termination mismatch.

Thus the present invention exploits the broadband characteristics of the serial digital signal from the serial digital source 12 to act as a "built-in" reference signal for the return-loss bridge. In the case of a serial digital video signal this broadband characteristic is a consequence of scrambling the data to make the signal spectrum independent of the binary data patterns the signal represents so that the data content does not affect transmission and detection. This characteristic allows the return-loss detection to be embedded in the signal source 12 and indicate changes in return-loss or transmission line fidelity without disturbing the normal transmission of data. This characteristic occurs and may be similarly exploited in other systems unrelated to serial digital video signals as well.

Also a signal sufficient to drive a transmission line is easily provided by ECL logic, and a single IC approach is in common use for serial digital video signal transmission. Since ECL signals are often generated in differential form, the differential input to the bridge circuit 16 does not need to be separately generated and eliminates the need for differential detection across the bridge, as described above. Therefore the present invention provides a return-loss detector for a serial digital source by using a return-loss bridge with a differential input, the termination for the system being a part of the bridge, and broadband detecting the output of the bridge to determine whether a mismatch occurs.

What is claimed is:

1. A return-loss detector for a serial digital signal source comprising:

means for generating a differential pair of serial digital signals from a serial digital signal output by the serial digital signal source;

a bridge circuit having as inputs the differential pair of serial digital signals and having a reference output terminal and a system output terminal, the system output terminal being coupled to a system being driven by the serial digital signal;

a detector coupled to the output terminals of the bridge circuit; and means for indicating from the output from the detector when a termination mismatch at the system output terminal occurs.

2. The return-loss detector as recited in claim 1 further comprising means for summing the differential pair of serial digital signals at the output terminals to provide a summed signal for input to the broadband detector.

3. The return-loss detector as recited in claim 1 wherein the bridge circuit comprises:

a first impedance arm coupled to the system output terminal at one end and receiving one of the differential pair of serial digital signals at the other end;

a second impedance arm coupled to the reference output terminal at one end and receiving the other of the differential pair of serial digital signals at the other end;

a reference impedance coupled between the reference output terminal and a reference potential, the system output terminal being coupled to a transmission channel having a characteristic impedance between the system output terminal and the reference potential, the value of the reference impedance being the characteristic impedance.

4. The return-loss detector as recited in claim 1 further comprising means for generating a swept frequency signal from the differential pair of serial digital signals at the output terminals.

5. The return-loss detector as recited in claim 4 wherein the generating means comprises:

means for summing the differential pair of serial digital signals at the output terminals to produce a summed signal; and means for heterodyning the summed signal with a swept local oscillator signal to produce a swept signal for input to the detector, the indicating means having a sweep control voltage for the swept local oscillator signal as one orthogonal input and the output from the detector as a second orthogonal input to provide a return-loss versus frequency display.

6. The return-loss detector as recited in claim 5 wherein the summing means comprises:

a first summing impedance coupled between the system output terminal and a summing point coupled to the input of the broadband detector; and a second summing impedance coupled between the reference output terminal and the summing point.

7. The return-loss detector as recited in claim 5 further comprising a broadband bandpass filter coupled between the output of the heterodyning means and the input to the broadband detector.

8. The return-loss detector as recited in claim 1 wherein the indicating means comprises a comparator coupled to receive the output from the detector for comparison with a return-loss threshold signal, the comparator providing an output signal for providing an indicator of termination mismatch when the return-loss threshold signal is exceeded.

* * * * *